(12) United States Patent
Lake et al.

(10) Patent No.: US 6,214,180 B1
(45) Date of Patent: Apr. 10, 2001

(54) METHOD FOR SHORTING PIN GRID ARRAY PINS FOR PLATING

(75) Inventors: Arden S. Lake, Poughkeepsie; Emanuele F. Lopergolo, Marlboro; Joseph M. Sullivan, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/257,816

(22) Filed: Feb. 25, 1999

(51) Int. Cl.⁷ .................................................. C25D 17/00
(52) U.S. Cl. ................................. 204/224 R; 204/297.1
(58) Field of Search ................................ 205/118, 125; 204/297.01, 224 R

(56) References Cited

U.S. PATENT DOCUMENTS

| | | | |
|---|---|---|---|
| 4,281,449 | * 8/1981 | Ports et al. | 29/593 |
| 4,288,911 | 9/1981 | Ports | 438/17 |
| 5,279,975 | 1/1994 | Devereaux et al. | 438/18 |
| 5,307,010 | 4/1994 | Chiu | 324/766 |
| 5,389,814 | 2/1995 | Srikrishnan et al. | 257/529 |
| 5,567,295 | 10/1996 | Swamy et al. | 205/125 |
| 5,869,139 | * 2/1999 | Biggs et al. | 427/282 |
| 5,935,404 | * 8/1999 | Farooq et al. | 205/125 |
| 5,985,128 | * 11/1999 | Farooq et al. | 205/666 |

* cited by examiner

Primary Examiner—Kathryn Gorgos
Assistant Examiner—Erica Smith-Hicks
(74) Attorney, Agent, or Firm—McGinn, & Gibb, PLLC; Ira D. Blecker, Esq.

(57) ABSTRACT

A method, system and structure for a pin grid or pad grid array structure includes a plurality of pins connected to an electronic structure, a power plane within the electronic structure electrically connected to power pins, a ground plane within the electronic structure, and fuse portions electrically connecting the ground plane to ground pins and signal pins. The power plane and the ground plane create a charge in the pins during electroplating of the pins. The fuse portions disconnecting the signal pins from the ground plane after the electroplating.

11 Claims, 7 Drawing Sheets

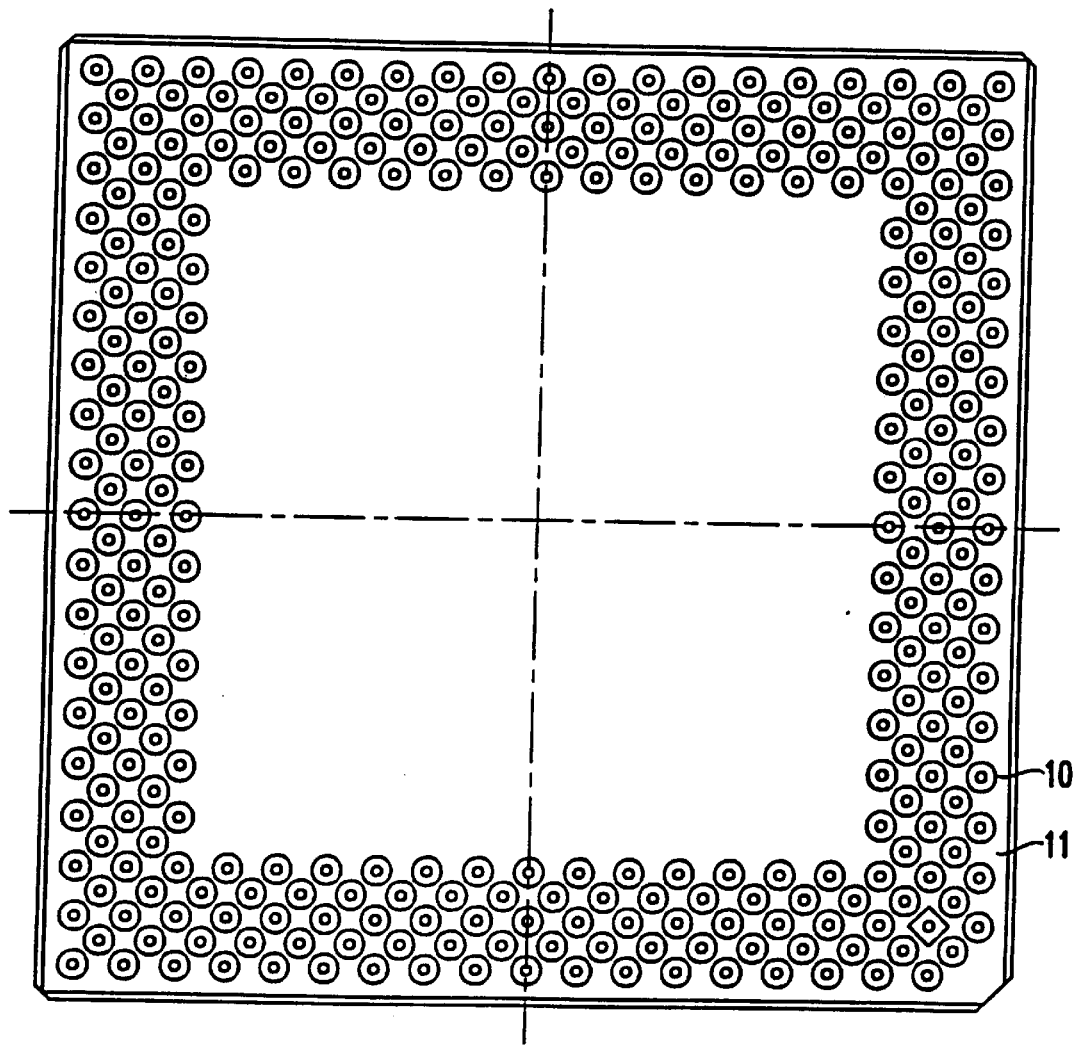
FIG.1A
PRIOR ART
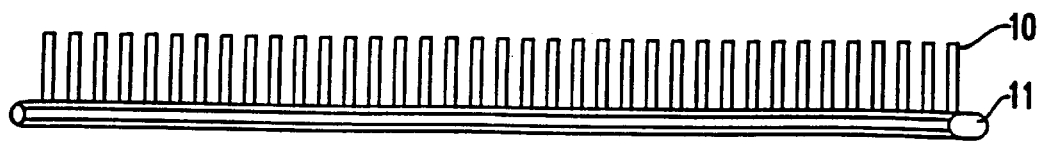
FIG.1B  PRIOR ART

METHOD FOR SHORTING PIN GRID ARRAY PINS FOR PLATING

BACKGROUND OF THE INVENTION

1. Field of the Invention

The present invention generally relates to the field of packaging for semiconductor products and is directed towards PGA (pin grid array) and LGA (land grid array) modules in particular. PGA and LGA modules typically consist of a ceramic or organic package containing an electronic device wired out to the PGA or LGA for the purpose of interconnecting to the next level of packaging.

2. Description of the Related Art

Conventional systems utilize standard techniques for manufacturing electronic device packages involving the use of pin grid arrays or land grid arrays. PGA or LGA packages provide for easy insertion and removal of the device through a plurality of conductive pins plugged into sockets mounted in the product assembly. An exemplary pin grid array package is shown in FIGS. 1A and 1B. More specifically, FIGS. 1A and 1B illustrate an array of pins/pads 10 formed on a device 11.

The pins/pads 10 in this array are typically nickel and/or gold plated to provide the desired electrical and mechanical characteristics including resistance to wear and corrosion, conductivity and solderability. Plating of these pins/pads 10 is typically done through electroplating which requires that an electrical contact be made to each of the pins 10 during the plating process.

Alternatively, the pads/pins 10 can be heavy gold plated with an electroless process, which requires that the pins 10 be placed in an electroless bath for an extended period of time (e.g., approximately 45 minutes to an hour depending on gold thickness). However, electroplating is more preferable because the electroplating process requires less time in the bath (e.g., approximately 10–12 minutes for the same gold thickness) and results in a more uniform plating.

In the electroplating process, the electrical contact spot generally will not be plated. Therefore, the contact with the pin 10 must be made in a "safe" area on the pin 10 and be kept as small as possible. "Safe" areas are areas where missing plating will not produce manufacturing defects. However, there are no truly "safe" areas for LGA products and, therefore, electroplating is not commonly used with LGA products.

In addition, the plating bath must be kept in constant motion such that local concentration of the bath does not see excessive change due to plate-out depletion. This requires an unimpeded flow of plating chemical around the pins 10 to be plated. Conventional contacts with the pin 10 can sometimes impede the flow of plating chemical.

One conventional electroplating system connects all input/output pins 10 to a common bus 20 at the edge of the package using leads 21, as shown in FIG. 2. After the plating process, the bus 20 is removed. However, this method leaves long leads 21 in the structure. The leads 21 commonly impede the performance of the package, for example, by acting as antennas and causing a high signal to noise ratio and potential "cross talk" of signals. Additionally, with ceramic packages it is very costly to removes the bus 20.

Another conventional electroplating system weaves wires between the pins in order to contact them on alternate sides. However, this is a very slow operation and is prone to forming poor contacts and inconsistent alignment to the "safe" area of the pin. Another conventional system uses a disposable mesh that fits around the pins. The mesh includes multiple contacts that press against the pin shank. However, such mesh structures leave large areas of the pin unplated and can damage pins/plating upon removal.

Also, one conventional electroplating system presses the pins into a conductive foil that is backed by a compliant member. However, such a conductive foil system has poor chemical flow as the foil backing is typically a solid face. Other conventional systems weld a conductive plate to the pin tips. However, this system requires extra steps to align and weld the plate and to shear the plate after the plating process has been completed.

These methods can leave marks on the pins and at times can be unreliable, making the electroplating process very costly. Additionally, with electroplating systems that attach a shorting member to the pins, all pins must be straight and must contact shorting media. Further, "shadowing" of the pins occurs when the fluid flow is restricted by the shorting media. Shadowing causes excessive usage of nickel and gold. Further, shorting media which comes in contact with the pins can leave a unplated blemish that can oxidize.

The cost associated with such conventional electroplating systems is increased by the number of assemblies which must be reworked. If only one pin out of the entire array is not plated properly, the entire array package must be reworked. Additionally, the costs associated with such a conventional systems is increased because the shorting media is plated along with the pins contributing to an excessive use of the plating material.

The invention described below overcomes the problems associated with conventional electroplating systems.

SUMMARY OF THE INVENTION

It is, therefore, an object of the present invention to provide a structure and method for making electrical contact to all pins or I/O (input/output) pads on a PGA (pin grid array) or LGA (land grid array) chip carrier package for the purpose of electroplating. Contrary to conventional structures, the electrical connections to the pins/pads are made by creating an additional ground plane or using an existing ground plane within the device which connects all signal pins (input/output's) together to ground.

More specifically, a first embodiment of the invention is a pin grid array structure having a plurality of pins connected to a chip carrier package/organic board, a power plane within the chip carrier package/organic board electrically connected to power pins, a ground plane within the chip carrier/organic board, and fuse portions electrically connecting the ground plane and ground and signal pins. The power plane and the ground plane create the cathode electrical charge in the pins during electroplating of the pins. The fuse portions disconnect the signal pins from the ground plane after the electroplating.

The ground plane may be a continuous, planar conductive layer within the chip carrier package or a conductive wire mesh layer within the chip carrier package. The mesh layer includes mesh lines (e.g., fuses) having a cross-sectional area smaller than the cross-sectional area of the fuse portions. Further, the ground plane includes insulation regions electrically isolating the pins from the ground plane.

Another embodiment of the invention is a system for electroplating a connection array having an internal power plane, an internal ground plane and connection points electrically connected to the internal power plane and the internal ground plane. The system includes an array manufacturing unit producing the connection array, an electroplating bath having a support and producing a plated connection array (the support making an electrical connection to the internal power plane and the internal ground plane), and a fusing unit for disconnecting the internal ground plane from signal connection points in the plated connection array.

The connection array includes fuse portions electrically connecting the internal ground plane and ground and signal connection points. The fusing unit blows the fuse portions and disconnects the signal connection points from the internal ground plane.

The fusing unit may include an array of sockets and a current line connected to the ground plane. The signal connection points are disconnected from the internal ground plane by application of current through the ground plane and referencing the signal pin connection points, one at a time.

Another embodiment of the invention is a method of electroplating which: provides a connection array having an internal power plane, an internal ground plane and connection points electrically connected to the internal power plane and the internal ground plane; attaches the internal power plane and the internal ground plane to a cathode to produce a charge in the connection points; submerges the connection points in a material bath; and disconnects the signal connection points from the internal ground plane.

The connection array includes fuse portions electrically connecting the internal ground plane and the connection points and the disconnecting comprises blowing the fuse portions.

The disconnecting includes connecting the ground plane to a current source and completing a circuit from the current source through the ground plane and through individual ones of the signal connection points. More specifically, the disconnecting includes applying a testing unit to the connection array, where the connection array includes the current source and units for completing the circuit individually through each of the signal connection points. The connection points comprise one of pins and pads and the disconnecting includes inserting the connection points into the testing unit.

The invention is an inexpensive system that provides the necessary electrical contact without damaging the chip carrier package, without masking off excessive or protected areas of the I/O pins or I/O pads and without restricting the flow of plating chemicals around the I/O pins or I/O pads.

The invention insures proper electrical contact for the purpose of plating an PGA or LGA product. The invention lends itself to a high volume manufacturing environrment by forming a simple and reliable electrical contact for the purpose of plating.

After the pin grid array package is plated, it is then inserted into a socket that applies a given current to the ground plane. Once the current is applied, it is referenced (directed) to a single signal pin or pad through an external contact with the pin. The current causes the line connected to the ground plane to open (e.g., fuse). This process is repeated until all signals are isolated from each other.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A–1D are schematic diagrams of a pin grid array and a land grid array;

DETAILED DESCRIPTION OF PREFERRED EMBODIMENTS OF THE INVENTION

The present invention provides an improved technique for plating pins of pin grid array (PGA) or pads of land grid array (LGA) packages for electronic devices such as integrated circuits.

Figure 1C:
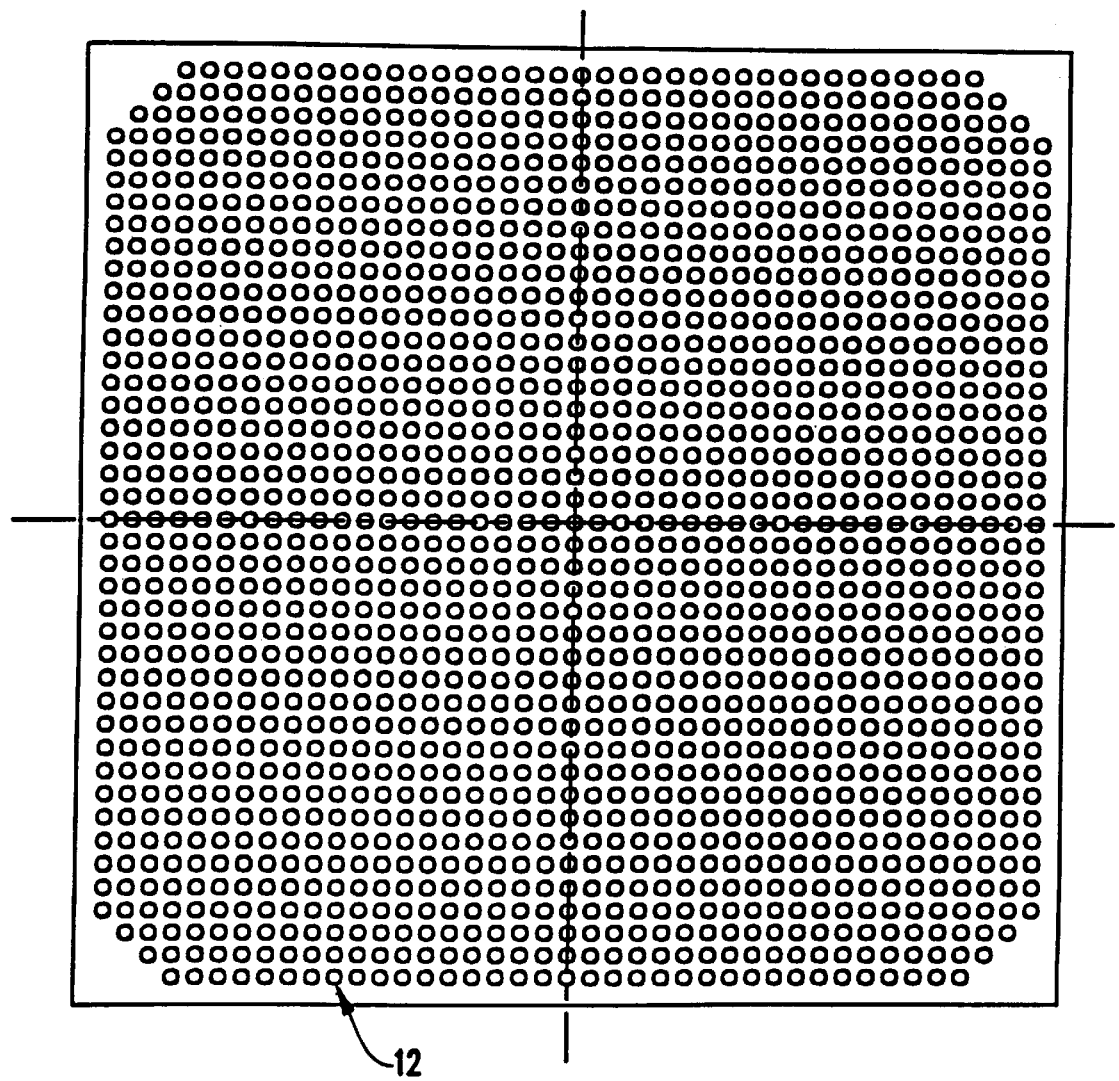
Figure 1D:
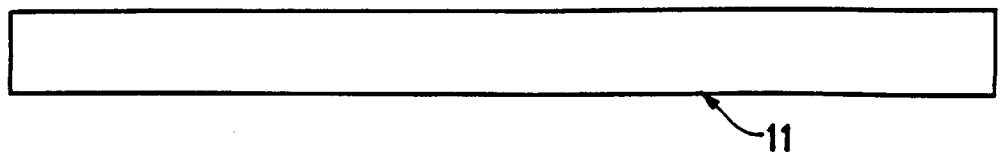
Figure 2:
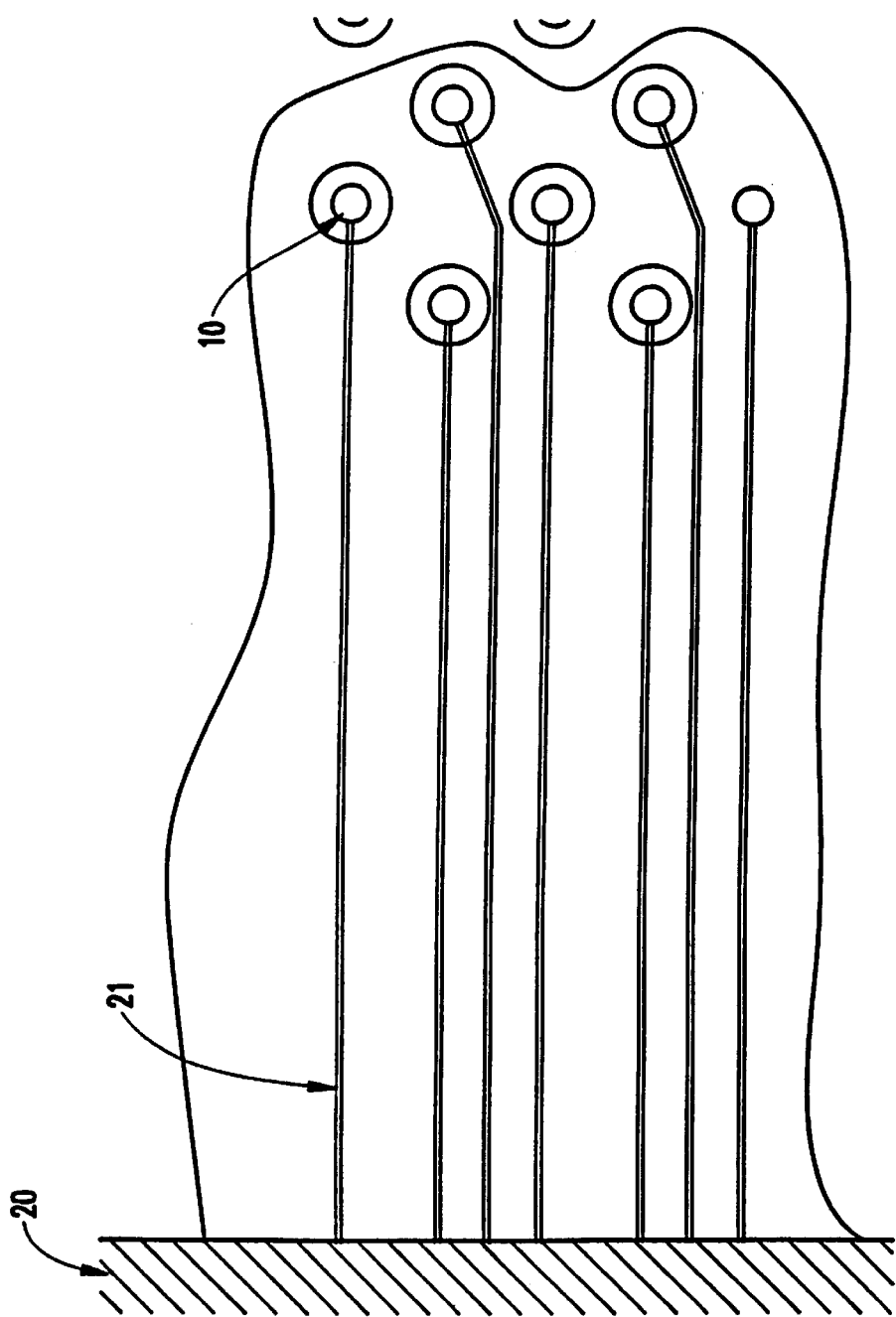
FIG. 2 is a schematic diagram illustrating a conventional electroplating system.

During the manufacturing of ceramic or organic packages, the pins/pads 10 (shown in the pin grid array in FIGS. 1A and 1B) are arranged in a grid array on one side of the chip carrier package 11, or pads 12 (shown in the land grid array in FIGS. 1C and 1D) are arranged on one side of the chip carrier package 11. The grid array is typically on the order of 20 mm×20 mm to 50 mm×50 mm in size. There are several layers/planes of circuitry within the chip carrier package 11 including power, ground, and data signal lines which allow the integrated circuit to perform its unique function.

By using (or adding) an existing ground plane within the chip carrier package 11 and temporarily tying all the signal pins and ground pins to the ground plane and permanently connecting all power pins to the power plane, all pins/pads 10 can be connected to a cathode side of a power source for the purpose of creating a charge in the pins/pads 10 during electroplating without requiring the external plating connections discussed in the Background section. The signal pins are permanently disconnected from the ground plane after the electroplating process by blowing connections between the signal pins and the ground plane while the ground pins remain connected to the ground plane.

Figure 3A:
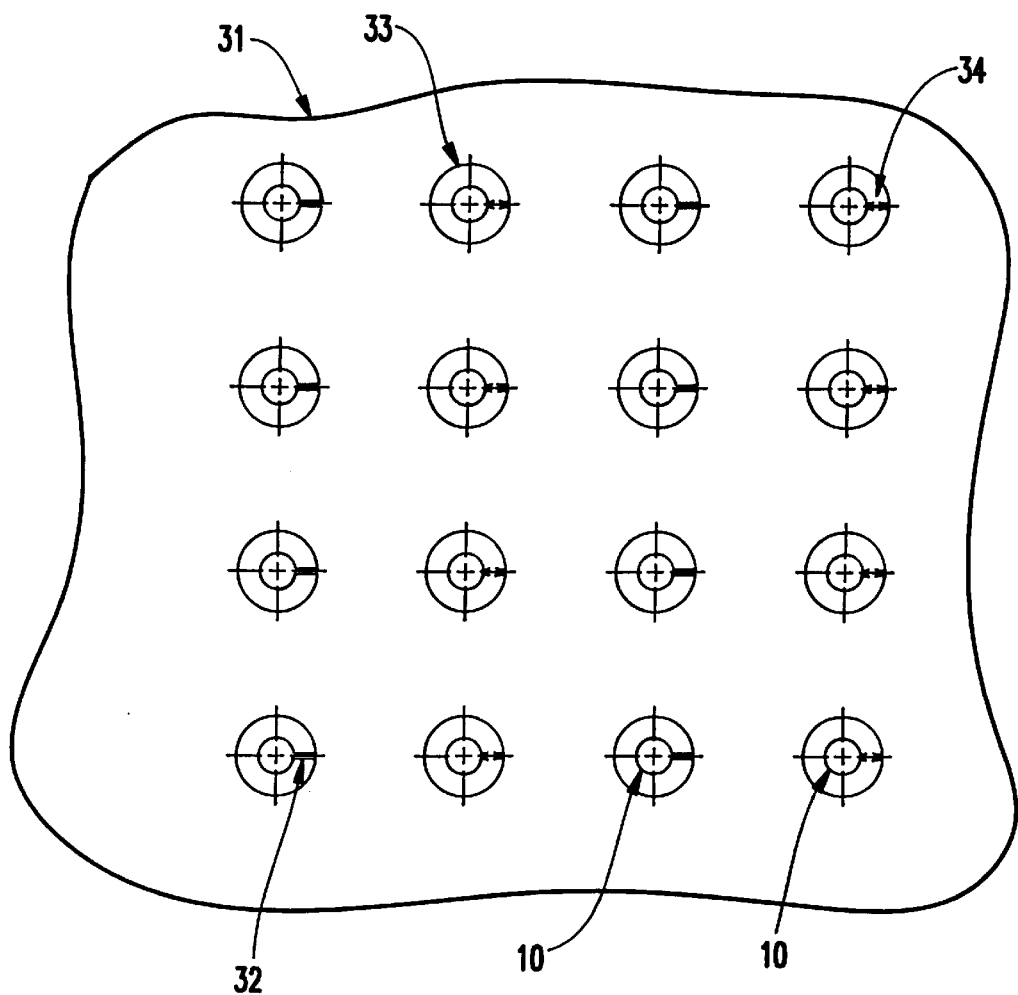
FIGS. 3A and 3B are schematic diagrams of a grounding planes according to the invention.
Figure 3B:
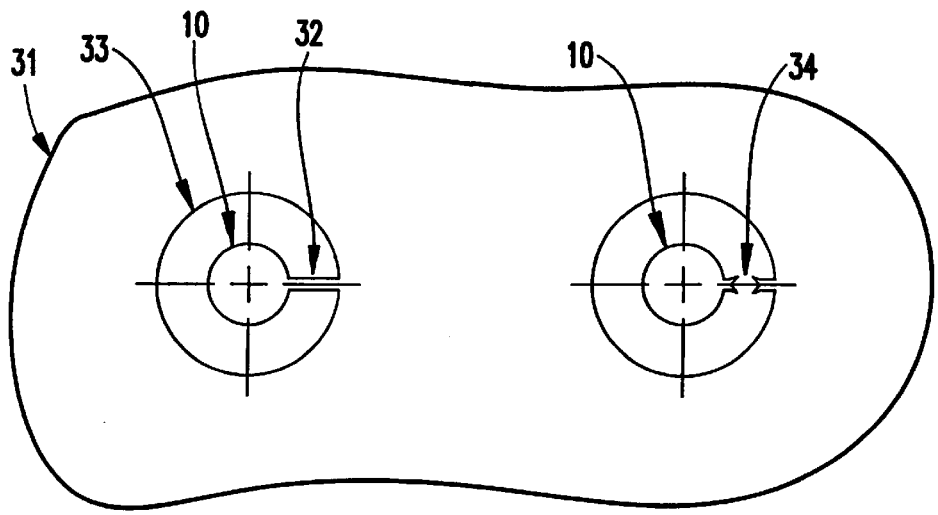

As shown in FIGS. 3A and 3B, a ground plane 31 provides contact to the pins/pads 10. The ground plane 31 comprises any conductive material such as a solid, continuous, unbroken, planar layer of metal, alloy or semiconductor. The pins 10 include an insulating region 33 electrically isolating the pins 10 from the ground plane 31. Electrical contact between the ground plane 31 and the pin 10 is made using a single fuse portion 32 which is necked down to each pin 10. The fuse portions 32 have a small cross-sectional area (e.g., 0.000002 in$^2$) such that the fuse portion 32 is easily opened when current is applied to the pin. A blown or open fuse portion 34 is illustrated in FIGS. 3A. FIG. 3B illustrates a magnified view of a portion of the structure shown in FIG. 3A.

Figure 4A:
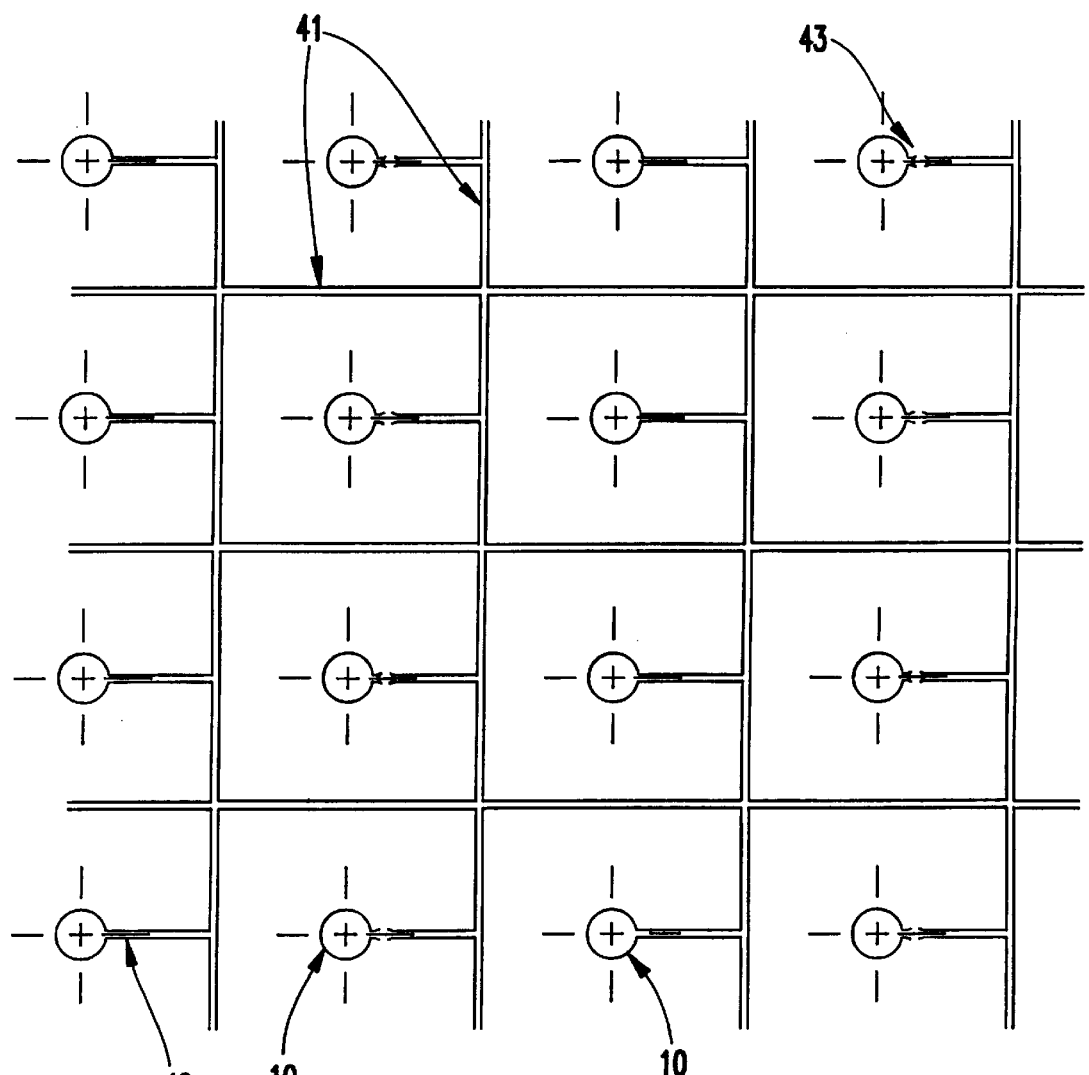
FIGS. 4A and 4B are schematic diagrams of a grounding mesh plane according to the invention.
Figure 4B:
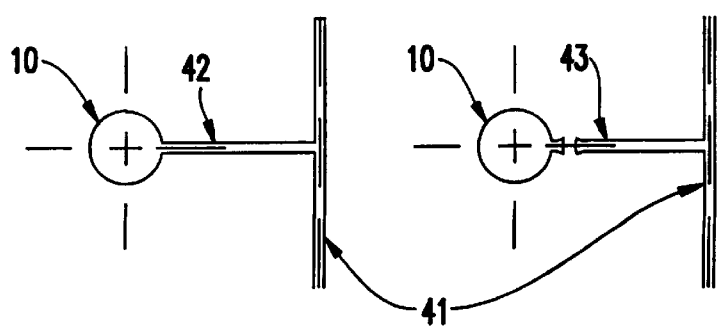

In another embodiment of the invention, illustrated in FIGS. 4A and 4B, the ground plane includes a mesh of lines 41 which have a larger cross-sectional area (e.g., 0.000004 in$^2$) than the fuse portions 32. Again, FIG. 4B is a magnified view of a portion of FIG. 4A. The mesh 41 includes fuse portion 42 which make contact between the ground plane 41 and pin 10. The fuse portion 42 in the mesh of lines 41 are "necked down" creating a small cross sectional area having a similar cross-sectional area as the fuse portions 32. Again the fuse portion sections 43 are easily opened when current is applied.

The grounding planes 31, 41 are formed within the conventional chip carrier package (e.g., grid pin array) using well-known techniques. For example, the chip carrier package 11 could comprise a multilayer semiconductor structure including different levels of wiring layers. One of the wiring layers could comprise the power plane and another to comprise the ground plane.

Figure 5A:
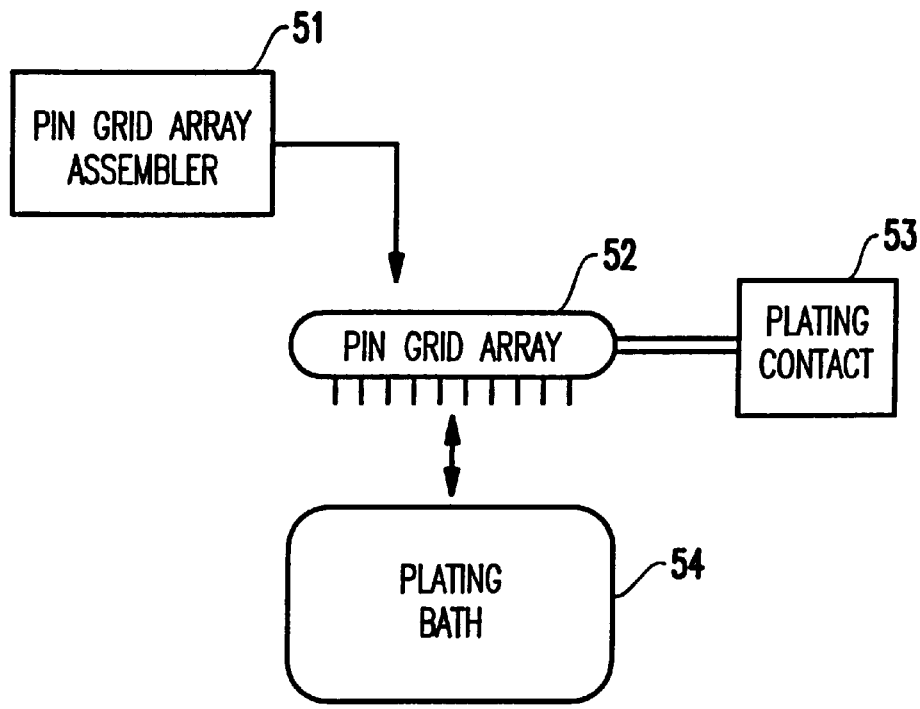
FIGS. 5A and 5B are schematic diagrams of an electroplating system according to the invention.
Figure 5B:
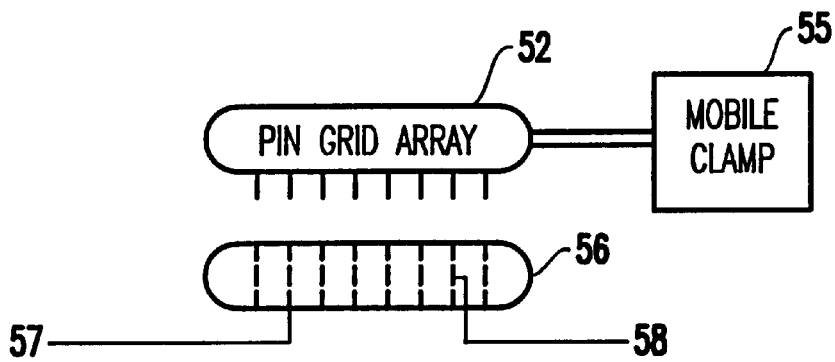

A system for plating the pin grid array and disconnecting the pins from the ground plane is illustrated in FIGS. 5A and 5B. More specifically, FIG. 5A illustrates a pin grid array manufacturing device 51 which performs all necessary operations prior to plating the pin grid array. A plating contact 53 holds the pin grid array 52 during its exposure to the anode plating bath 54. The plating contact 53 electrically connects the power plane and ground plane within the pin grid array. One of the two lines shown between the pin grid array 52 and the plating contact 53 connects the ground plane to the cathode and the other line connects the power plane to the cathode. FIG. 5B illustrates a mobile clamp 55 which positions the pin grid array 52 within a testing/fusing fixture 56. FIG. 5B also illustrates the current source 57 and the signal pin/pad multiplexor reference source 58. The testing/fusing fixture 56 is used to electrically test the pin grid array and to supply the current required to open the fuse portions 32, 42.

More specifically, the packages 52 are manually or automatically "plugged" into the plating contact fixture 53 that contains and holds a group of packages 52 during the plating operation. This fixture 53, in addition to supporting the package 52, includes contacts to both the ground and power planes that provide an electrical path to facilitate the plating process. After plating, the packages 52 can be easily unplugged from the fixture 53 by hand or via an automated process and the fixtures 53 are reused for the next plating cycle.

After the package 52 is plated, it is then inserted into the testing/fusing socket 56 that will apply a given current to the ground plane. Once the current is applied, it is reference to each of the signal pins or pads individually by electrically connecting the plated pins (one at a time) to an electrical contact which will allow the current to flow through the pin. The current causes fuse portion 32, 42 to open.

In other words, a current is applied to the ground plane 31, 41 and the signal pins 10 are individually connected one at a time to complete the circuit and individually open each fuse portion 32, 42. The current is adjusted to exceed the current rating for the cross-sectional area of the fuse portion 32, 42.

Therefore, upon application of the current, the fuse portion 32, 42 melts and/or vaporizes and becomes non-conductive. However, the current is well below the current rating for the pins and does not affect the pins themselves. Thus, the fuse portion 32, 42 disconnects the signal pins from the grounding plane 31, 41. This process is repeated for all signal pins/pads 10 until all signal pins 10 are isolated from each other and from the grounding plane 31, 41, while no ground pin 10 is disconnected from the ground plane 31, 41.

An important benefit of the invention is that the fuse portion 32, 42 is opened directly next to the pin 10, which prevents any long leads from remaining connected to the pins 10. Thus, with the invention, there is little or no chance of the ground plane 31, 41 acting as an antenna and causing cross-talk. The connection 32, 42 to the ground plane 31, 41 is designed to allow sufficient spacing such that when the connection is fused, it will happen at a point which will not effect any other circuit.

Figure 6:
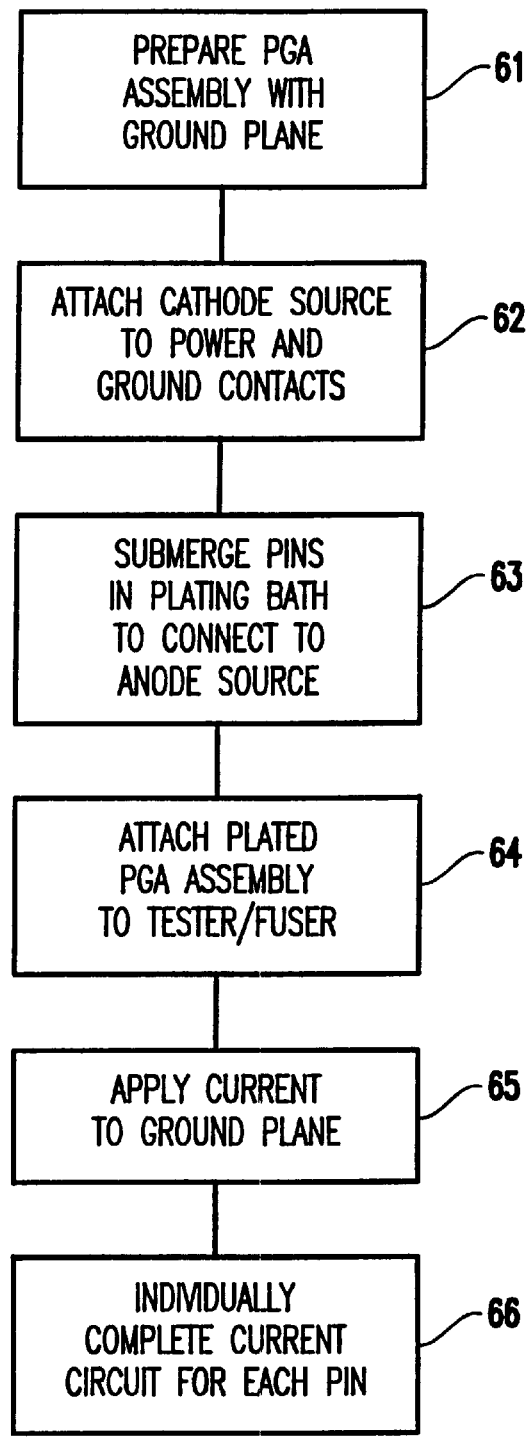
FIG. 6 is a flowchart illustrating a preferred embodiment of the invention.

The foregoing embodiment of the invention is shown in flowchart form in FIG. 6. More specifically, the pin grid array is manufactured to include a ground plane 61 and the power and ground contacts are attached 62 to the cathode contact. The pins are then submerged in the anode plating bath which electroplates the pins 63. The pin grid array assembly is then removed from the plating bath and attached to the tester/fuser 64 and a current is applied to the ground plane 65. Each of the signal pins is individually connected to complete the circuit and open the fuse portion to isolate the pin from the ground plane 66.

Thus, with the inventive ground plane 31, 41 (as opposed to long ground leads 21) there are no unterminated leads, which may act as antennas, as discussed in the background section. Indeed, the inventive ground plane shields the other signal lines in the device from electromagnetic interference.

The invention produces many advantages over conventional plating systems. For example, with the invention, it is not necessary that all the pins in a pin grid array be straight because the connection to the grounding plane is made internally within the chip carrier package and is not made externally. Conventionally, the pins would have to be straight in order to properly contact the externally applied grounding material in the "safe" area. In addition, the invention is simpler than the conventional systems because there is no need to properly align or insure that the shorting media contacts the pins.

Further, since there is no physical contact between the grounding plane and the pins, the entire surface of the pin will be plated with the plating material. To the contrary, with conventional grounding media which contacts the pins, the portions of the pin and which is in contact with the grounding media is not plated.

Additionally, the amount of plating material required in the plating process is reduced because no plating material is wasted on the grounding media. Also, because the pins are not connected to an external grounding media, there is substantially less chance that the pins will be damaged during the plating process. There is no shadowing effect from the shorting media, which results in a more uniform plating, and overall savings in cost.

Further, since no external contact is made to the structure, land grid arrays can be electroplated with the invention (rather than the electroless method required conventionally) which results in uniform plating, shorter plating time and a more desirable plating method (e.g., less hazards, lower costs, etc.).

While the invention has been described in terms of preferred embodiments, those skilled in the art will recognize that the invention can be practiced with modification within the spirit and scope of the appended claims.

What is claimed is:

1. A pin grid array structure comprising:
   a plurality of first pins and second pins connected to an electronic structure;
   a power plane within said electronic structure electrically connected to said first pins;
   a ground plane layer within said electronic structure; and
   fuse portions adapted to electrically connect said ground plane and said second pins,
   said power plane and said ground plane layer being adapted to create a charge in said first pins and said second pins during electroplating of said first pins and said second pins, and said fuse portions being adapted to electrically disconnect ones of said second pins from said ground plane layer after said electroplating.

2. The structure in claim 1, wherein said ground plane layer comprises a continuous, planar conductive layer within said electronic structure.

3. The structure in claim 1, wherein said ground plane layer comprises a conductive wire mesh layer within said electronic structure.

4. The structure in claim 3, wherein said mesh layer includes mesh lines having a first cross-sectional area and said fuse portions have a second cross-sectional area less than said first cross-sectional area.

5. The structure in claim 1, wherein said ground plane layer includes isolation regions electrically isolating said second pins from said ground plane.

6. An electronic structure comprising:

first connection points and second connection points;

a power plane electrically connected to said first connection points;

fuse portions electrically connected to said second pins; and a ground plane layer electrically connected to said fuse portions, said power plane and said ground plane layer being adapted to create a charge in said first connection points and said second connection points during electroplating of said first connection points and said second connection points, said fuse portions being adapted to electrically disconnect said ground plane layer from ones of said second connection points after said electroplating.

7. The structure in claim 6, wherein said ground plane layer comprises a continuous, planar conductive layer within said electronic structure.

8. The structure in claim 6, wherein said ground plane layer comprises a conductive wire mesh layer within said electronic structure.

9. The structure in claim 8, wherein said mesh layer includes mesh lines having a first cross-sectional area and said fuse portions have a second cross-sectional area less than said first cross-sectional area.

10. The structure in claim 6, wherein said ground plane layer includes isolation regions electrically isolating said second connection points from said ground plane.

11. The structure in claim 6, wherein said first connection points and said second connection points comprises an array of one of pins and pads.

* * * * *